US008476086B2

(12) United States Patent
Fujiwara et al.

(10) Patent No.: US 8,476,086 B2
(45) Date of Patent: Jul. 2, 2013

(54) SEMICONDUCTOR DEVICE AND METHOD OF ITS MANUFACTURE

(75) Inventors: Shinsuke Fujiwara, Itami (JP); Takashi Sakurada, Itami (JP); Makoto Kiyama, Itami (JP); Yusuke Yoshizumi, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 520 days.

(21) Appl. No.: 11/947,752

(22) Filed: Nov. 29, 2007

(65) Prior Publication Data

US 2008/0128706 A1   Jun. 5, 2008

(30) Foreign Application Priority Data

Nov. 30, 2006   (JP) ................................. 2006-324246

(51) Int. Cl.
  *H01L 33/00* (2010.01)
(52) U.S. Cl.
  USPC .................. 438/14; 438/47; 438/46; 257/48; 257/103; 257/E33.034; 324/762.05
(58) Field of Classification Search
  USPC .................................................... 438/14, 47
  See application file for complete search history.

(56) References Cited

U.S. PATENT DOCUMENTS

| 6,235,543 | B1 * | 5/2001 | Kiyama | 438/5 |
| 6,252,261 | B1 * | 6/2001 | Usui et al. | 257/190 |
| 7,687,824 | B2 * | 3/2010 | Shibata et al. | 257/103 |

FOREIGN PATENT DOCUMENTS

| JP | H10-335750 A | 12/1998 |
| JP | 2000-252219 A | 9/2000 |
| JP | 2001-185487 A | 7/2001 |
| JP | 2002-246686 A | 8/2002 |
| JP | 2002-348199 A | 12/2002 |
| JP | 2003-037288 A | 2/2003 |
| JP | 2004-063635 A | 2/2004 |
| JP | 2004-221480 A | 8/2004 |
| JP | 2004-335646 A | 11/2004 |
| WO | WO-2006-124067 A1 | 11/2006 |

OTHER PUBLICATIONS

Xueping Xu, et al., "Growth and Characterization of Low Defect GaN by Hydride Vapor Phase Epitaxy," Journal of Crystal Growth, 2002, pp. 223-229, vol. 246, Elsevier, Amsterdam, NL.
Akira Usui, et al., "Thick GaN Epitaxial Growth with Low Dislocation Density by Hydride Vapor Phase Epitaxy," Japanese Journal of Applied Physics, Jul. 15, 1997, pp. L899-L902, vol. 36, the Japan Society of Applied Physics, Tokyo.

(Continued)

*Primary Examiner* — Jerome Jackson, Jr.
(74) *Attorney, Agent, or Firm* — James W. Judge

(57) ABSTRACT

Method of high-yield manufacturing superior semiconductor devices includes: a step of preparing a GaN substrate having a ratio $S_r/S$—of collective area ($S_r$ cm$^2$) of inversion domains in, to total area (S cm$^2$) of the principal face of, the GaN substrate—of no more than 0.5, with the density along the (0001) Ga face, being the substrate principal face, of inversion domains whose surface area where the polarity in the [0001] direction is inverted with respect to the principal domain (matrix) is 1 μm$^2$ or more being D cm$^{-2}$; and a step of growing on the GaN substrate principal face an at least single-lamina semiconductor layer to form semiconductor devices in which the product $S_c \times D$ of the area $S_c$ of the device principal faces, and the density D of the inversion domains is made less than 2.3.

9 Claims, 5 Drawing Sheets

Leakage current density (A/cm$^2$)

Surface area of inversion domains (μm$^2$)

OTHER PUBLICATIONS

D. Martin et al., "High Quality Thin GaN Templates Grown by Hydride Vapor Phase Epitaxy on Sapphire Substrates," Applied Physics Letters, Jun. 12, 2006, vol. 88, No. 24, pp. 241914-1 to 241914-2, American Institute of Physics, NY.

Xiangqian Xiu et al., "Effect of Additional HCl Flow on the Surface Morphology of GaN Grown on Sapphire by HVPE," Proceedings of the 6th International Conference on Solid-State and Integrated Circuit Technology, Oct. 22-25, 2001, vol. 2, pp. 1195-1197, IEEE, NJ.

A.P. Grzegorczyk et al., "Influence of Sapphire Annealing in Trimethygallium Atmosphere on GaN Epitaxy by MOCVD," Journal of Crystal Growth, Sep. 15, 2005, vol. 283, No. 1-2, pp. 72-80, Elsevier, Amsterdam, NL.

Way Kuo et al., "An Overview of Manufacturing Yield and Reliability Modeling for Semiconductor Products," Proceedings of the IEEE, Aug. 1999, vol. 87, No. 8, IEEE, NY.

\* cited by examiner

SEMICONDUCTOR DEVICE AND METHOD OF ITS MANUFACTURE

BACKGROUND OF THE INVENTION

1. Technical Field

The present invention relates to semiconductor devices including light-emitting diodes, electronic devices, and semiconductor sensors, and to methods of manufacturing the semiconductor devices; in particular the present invention relates to semiconductor devices incorporating a reduced-dislocation-density GaN substrate, and to methods of manufacturing such devices.

2. Description of the Related Art

Designing for improved characteristics in various GaN-substrate or other III-nitride-substrate employing semiconductor devices, such as light-emitting diodes, electronic devices, and semiconductor sensors, is demanding low dislocation density from the substrates.

Examples that have been proposed of how to manufacture such III-nitride substrates of low dislocation density include the following. X. Xu et al., in "Growth and Characterization of Low Defect GAN by Hydride Vapor Phase Epitaxy," *Journal of Crystal Growth*, 246, (2002), pp. 223-229 ("Non-Patent Literature 1" hereinafter) report that dislocation density decreases with increasing thickness of the grown crystal, and that, for example, growing GaN crystal to a thickness of 1 mm or more on a normative substrate of chemical composition different from that of GaN lowers the dislocation density to a level of $1 \times 10^6$ cm$^{-2}$ or less.

Meanwhile, A. Usui et al., "Thick GaN Epitaxial Growth with Low Dislocation Density by Hydride Vapor Phase Epitaxy," *Japanese Journal of Applied Physics*, Vol. 36 (1997), pp. L899-L902 ("Non-Patent Literature 2" hereinafter) report that in growing GaN crystal onto a non-native substrate, creating facets by forming a mask layer having apertures makes it possible to control the orientation in which dislocations propagate, and thereby lower the GaN crystal dislocation density.

Nevertheless, GaN crystal, and GaN substrates obtained from the crystal, grown by the crystal growing methods of Non-Patent Literature 1 or Non-Patent Literature 2, proved to be plagued with serious defects apart from dislocations, although the density of the dislocations is in fact lowered to about $1 \times 10^6$ cm$^{-2}$. The defects were readily detected, inasmuch as the GaN substrate was etched with an alkali, leaving it pitted. In particular, when a specular-polished (0001) Ga face of a GaN substrate was etched for some tens of minutes in an aqueous KOH solution at 50° C., the areas where defects were present were etched to a depth of several μm, forming pits. Furthermore, etching the specular (0001) Ga face of the GaN substrate with molten KOH, molten NaOH melt, or a molten KOH/NaOH mixture, pitted the Ga face with roughly hexagonal columns, walled by N faces.

GaN is a crystal having polarity in the [0001] direction, and a characteristic trait of GaN crystal is that its (0001) Ga faces are not readily etched with alkalis, whereas its (000$\bar{1}$) N faces are readily alkali-etched. From this perspective, it is apparent that the GaN crystal and GaN substrate discussed above have two types of domains that differ in polarity. The two domains are defined as the principal domain (matrix), which is the majority, polarity-determining domain of GaN crystal and GaN substrates, and inversion domains, which are domains in which the polarity in the [0001] direction is inverted with respect to the matrix. This means that on a (0001) Ga face that is the principal plane of a GaN substrate, both the (0001) Ga face of the matrix as well as (000$\bar{1}$) N faces of inversion domains appear. Therefore, when a (0001) Ga face that is the principal plane of a GaN crystal is etched, the inversion domains become more etched than the matrix, such that approximately hexagonal columnar pits form from the inversion domains. In other words, the hexagonal columnar pits are pits that originate in the inversion domains.

Meanwhile, along the principal plane of a GaN substrate, pits originating in dislocations are not the result of etching with KOH solution at 50° C. for some tens of minutes, but are the result of etching with the molten KOH/NaOH mixture. Yet since they are in the form of hexagonal pyramids having ridgelines, pits originating in dislocations are readily distinguished from pits originating in inversion domains. It should be noted that, other than by the etching mentioned above, the principal and inversion domains can be readily distinguished from each other also by cathodoluminescence (CL), or by observation under a florescence microscope, because the luminosities of the two domains differ distinctly.

In implementations in which GaN crystal is grown on a non-native substrate, a low-temperature buffer layer is generally formed on the non-native substrate, as is the case in Non-Patent Literatures 1 and 2, but in thus growing GaN crystal on a non-native substrate with a low-temperature buffer layer intervening, inversion domains inevitably form. This has meant that general GaN crystal will contain inversion domains.

BRIEF SUMMARY OF THE INVENTION

Accordingly, an object of the present invention, brought about in order to resolve issues such as discussed above, is to make available semiconductor device manufacturing methods, whereby evaluating impact of the presence and sizes of the inversion domains on the properties of a semiconductor device manufactured by forming on a typical GaN crystal substrate a plurality of semiconductor layers leads to high-yield manufacturing of semiconductor devices having superior characteristics.

One aspect of the present invention is a semiconductor device manufacturing method comprising: a step of preparing a GaN substrate having a ratio $S_i/S$, of collective area $S_i$ cm$^2$ of inversion domains to total area S cm$^2$ of the GaN substrate principal face, of no more than 0.5, with the density along the (0001) Ga face, being the GaN substrate principal face, of inversion domains whose surface area where the polarity in the [0001] direction is inverted with respect to the matrix is 1 μm$^2$ or more being D cm$^{-2}$; and a step of growing on the GaN substrate principal face an at least single-lamina semiconductor layer to form a semiconductor device in which the product $S_c \times D$ of the surface area $S_c$ of the semiconductor device principal face and the inversion-domain density D is made less than 2.3.

Furthermore, in the semiconductor device manufacturing method involving the present invention, the ratio $S_i/S$ can be made 0.2 or less, and the product $S_c \times D$ less than 0.7. Additionally, the ratio $S_i/S$ can be brought to 0.05 or less, and the product $S_c \times D$ to less than 0.1. Still further, the area of the GaN substrate principal face may be made 10 cm$^2$ or more. The GaN substrate can be manufactured also by vapor phase techniques. Herein, among vapor-phase techniques, hydride vapor phase epitaxy (HVPE) can be utilized.

The present invention in another aspect is a semiconductor device manufactured by the above manufacturing method.

According to the present invention, semiconductor device manufacturing methods whereby semiconductor devices having superior characteristics are manufactured at high yields are made available.

From the following detailed description in conjunction with the accompanying drawings, the foregoing and other objects, features, aspects and advantages of the present invention will become readily apparent to those skilled in the art.

DETAILED DESCRIPTION OF THE INVENTION

Embodiment Mode 1

Figure 1A:
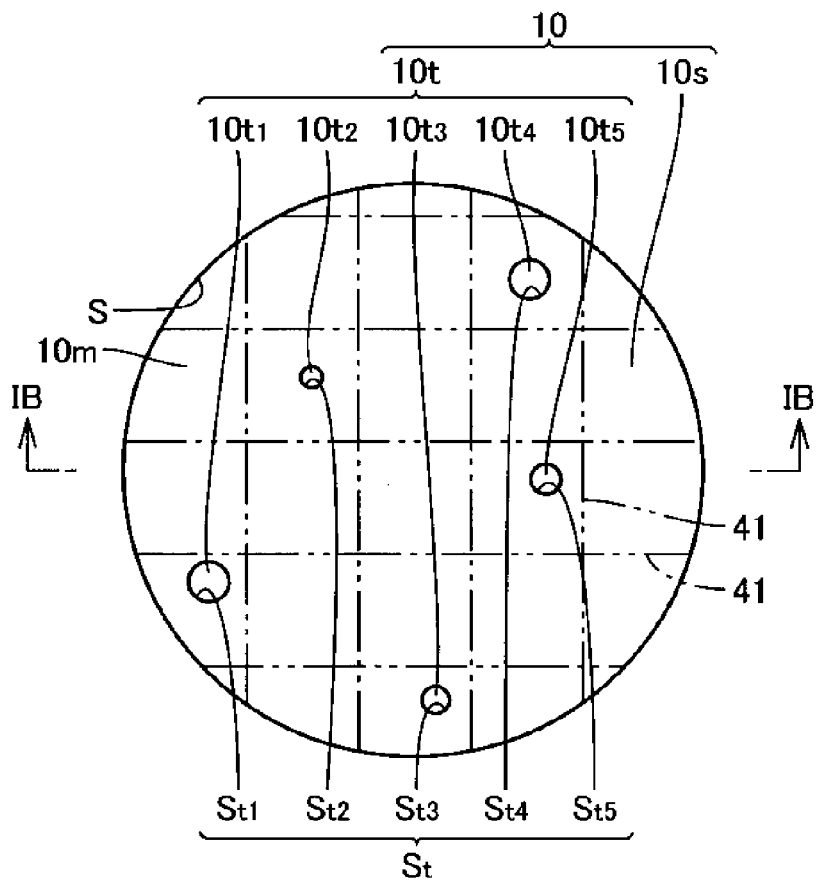
FIG. 1A, in a schematic diagram representing a GaN-substrate preparation step in a semiconductor device manufacturing method involving the present invention, is an outline upper-surface view illustrating a GaN substrate.
Figure 1B:
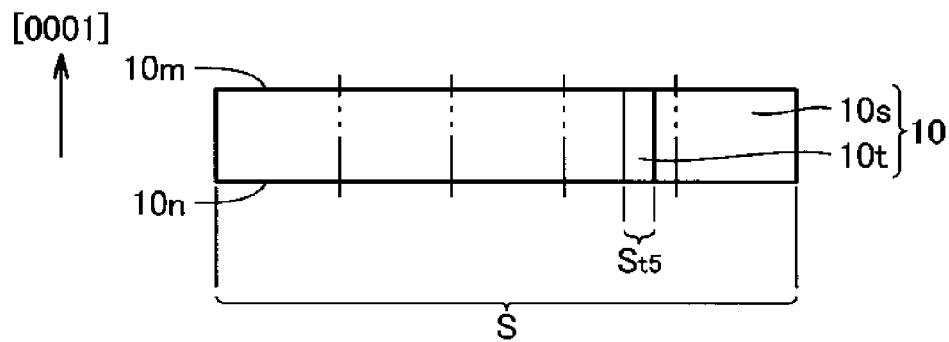
FIG. 1B, in a schematic diagram representing a GaN-substrate preparation step in a semiconductor device manufacturing method involving the present invention, is an outline sectional view taken along the line IB-IB in FIG. 1A, seen in the direction of the arrows.
Figure 2A:
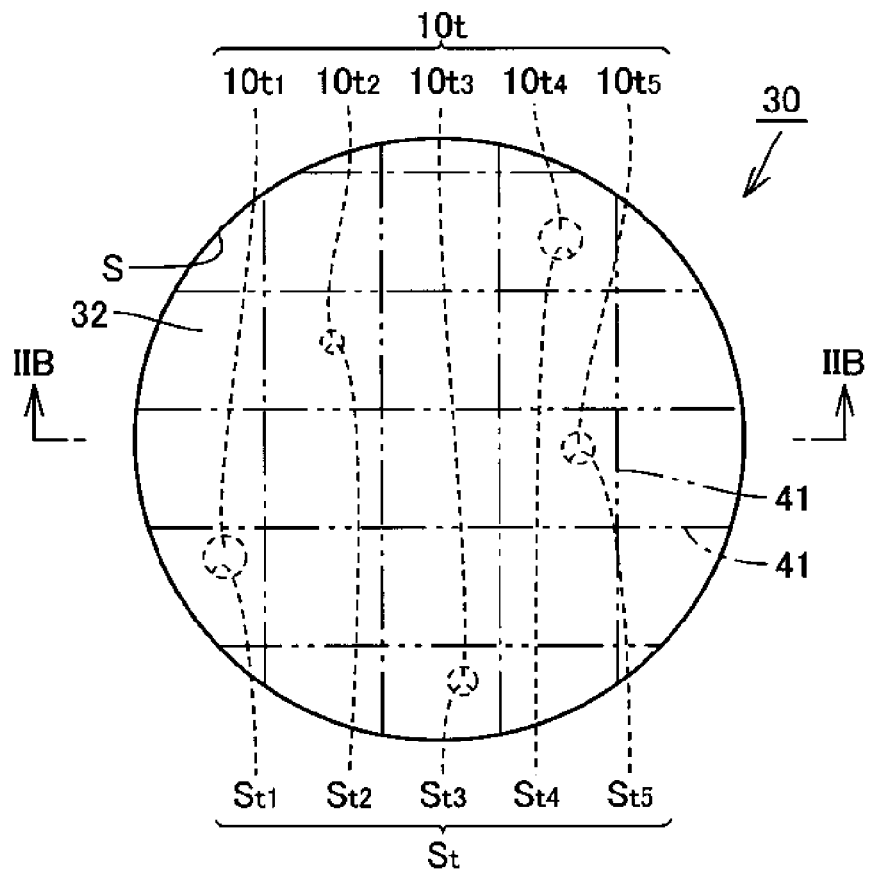
FIG. 2A, in a schematic diagram representing the semiconductor-layer growth step in a semiconductor device manufacturing method involving the present invention, is an outline upper-surface view illustrating a semiconductor wafer.
Figure 2B:
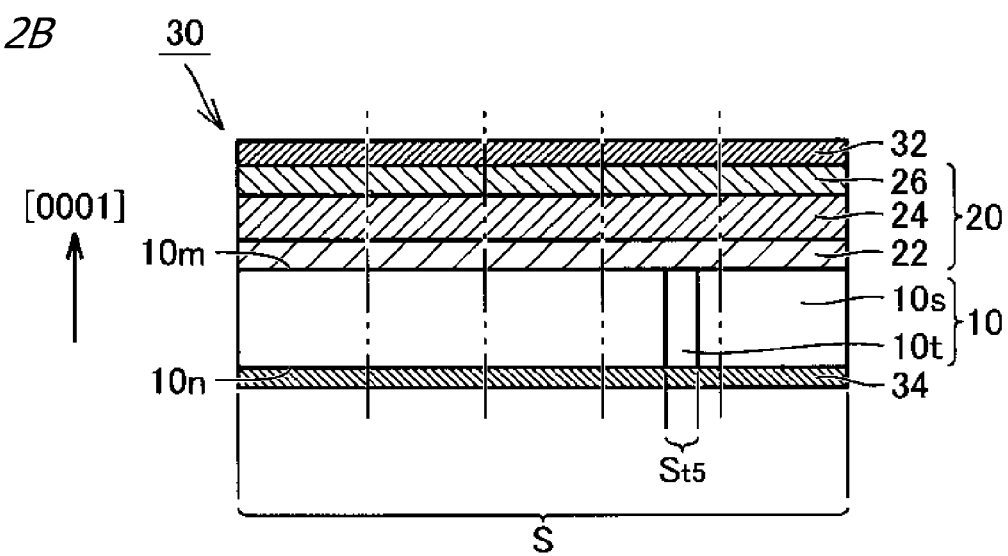
FIG. 2B, in a schematic diagram representing the semiconductor-layer growth step in a semiconductor device manufacturing method involving the present invention, is an outline sectional view taken along the line IIB-IIB in FIG. 2A, seen in the direction of the arrows.
Figure 3A:
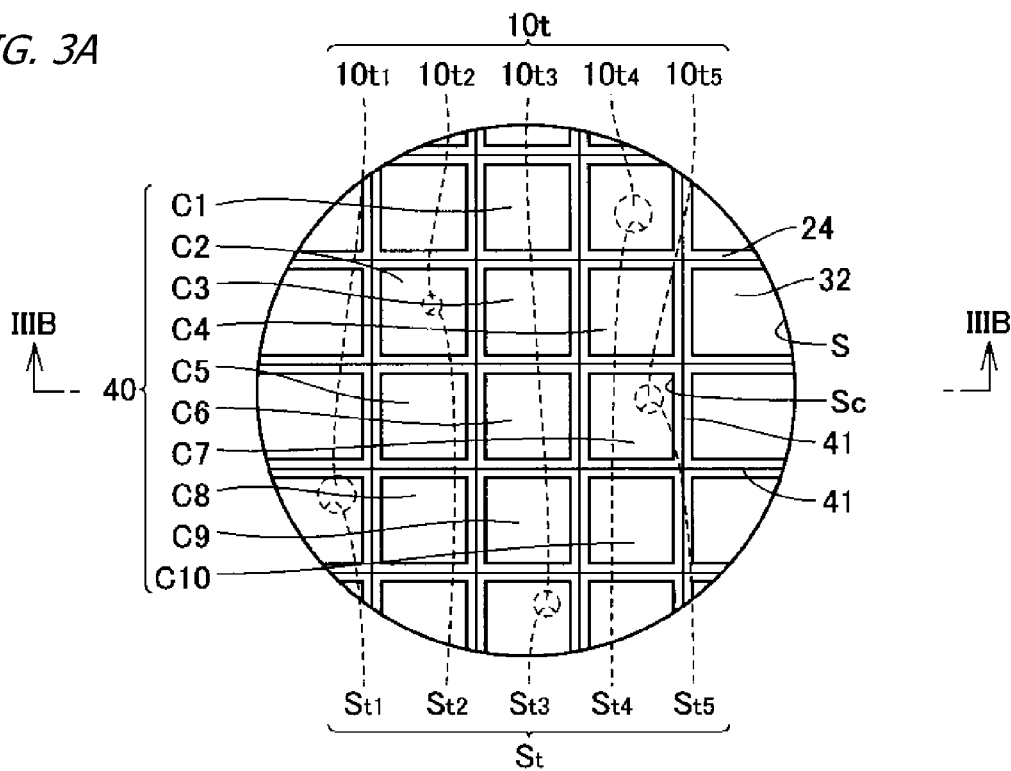
FIG. 3A, in a schematic diagram representing a semiconductor-device formation step in a semiconductor device manufacturing method involving the present invention, is an outline upper-surface view illustrating a semiconductor wafer.
Figure 3B:
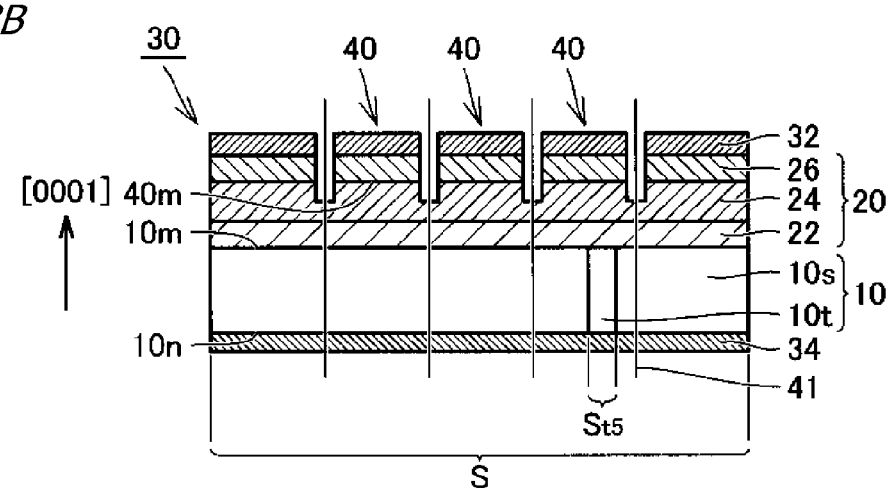
FIG. 3B, in a schematic diagram representing a semiconductor-device formation step in a semiconductor device manufacturing method involving the present invention, is an outline sectional view taken along the line IIIB-IIIB in FIG. 3A.

With reference to FIG. 1 through FIG. 3, one embodiment mode of a semiconductor device manufacturing method involving the present invention includes: a step of preparing a GaN substrate 10 having a ratio $S_t/S$ of collective area $S_t$ cm² of inversion domains 10$t$ to the total surface area S cm² of the principal face 10$m$ of the GaN substrate 10, of no more than 0.5, with the density along the (0001) Ga face, being principal face 10$m$ of the GaN substrate 10, of inversion domains 10$t$ whose surface area where the polarity in the [0001] direction is inverted with respect to the matrix 10$s$ is 1 μm² or more being D cm⁻² (FIG. 1); and a step of growing on the principal face 10$m$ of the GaN substrate 10 an at least single-lamina semiconductor layer 20 to form semiconductor devices 40, in which the product $S_c \times D$ of the area $S_c$ of the principal faces 40$m$ of the semiconductor devices 40 and the density D of the inversion domains 10$t$ is made less than 2.3 (FIGS. 2 and 3).

Including these steps makes it possible to afford semiconductor device manufacturing methods whereby semiconductor devices having superior characteristics are manufactured at high yields. Below, these features are explained in detail.

Figure 4:
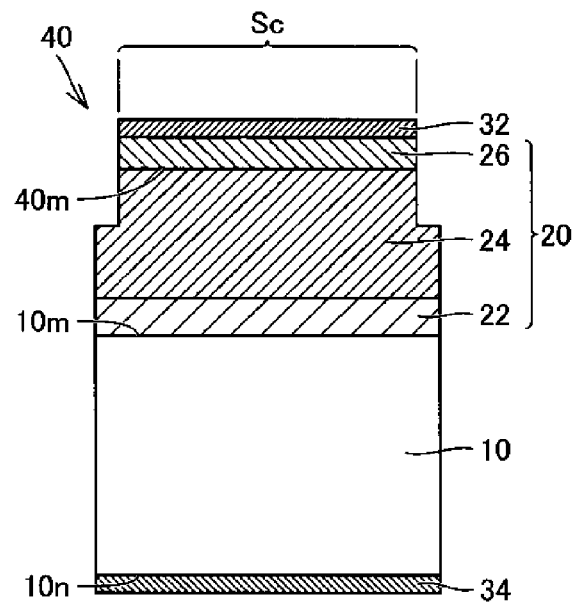
FIG. 4 is an outline section diagram illustrating one embodiment of a semiconductor device involving the present invention.

First, a study of the relationship between the presence of the inversion domains that a GaN substrate in a semiconductor device has and the properties of the semiconductor device was made. Referring to FIG. 4, as a semiconductor layer 20, a 0.6-μm thick n⁺-type GaN layer 22, a 7-μm thick n-type GaN layer 24 (with an electron concentration of $3 \times 10^{16}$ cm⁻³), and a 0.5-μm thick p-type GaN layer 26 (with an Mg atom concentration of $7 \times 10^{17}$ cm⁻³) were formed on the principal face 10$m$ of a 400-μm thick n-type GaN substrate (the GaN substrate 10) in which the locations of inversion domains was comprehended. (The density of the inversion domains on the substrate principal face was 20 cm⁻², and the surface area of the inversion domains was 1 to 10,000 μm²). A p-n junction, being the semiconductor device principal faces 40$m$, was thus formed between the n-type GaN layer 24 and the p-type GaN layer 26. Next, an Ni/Au laminated electrode, serving as a p-side electrode 32, was formed onto the p-type GaN substrate 26, and a Ti/Al laminated electrode, serving as an n-side electrode 34, was formed onto the back side 10$n$ (the side opposite from the principal face 10$m$) of the n-type GaN substrate (the GaN substrate 10), to produce the semiconductor devices 40, whose principal faces 40$m$ had a surface area of 1 cm².

Figure 5:
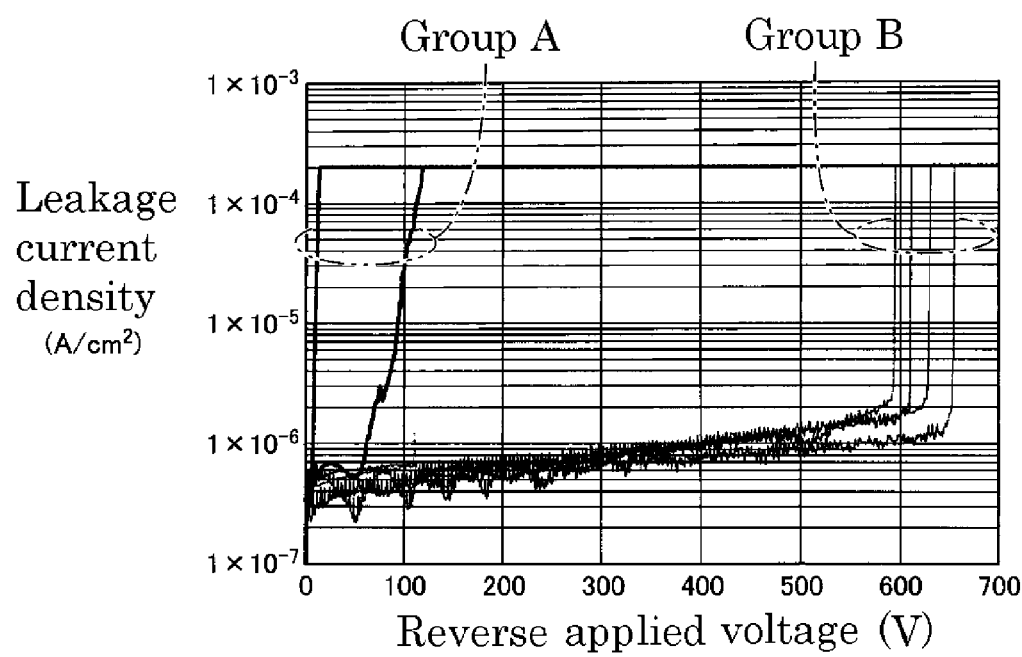
FIG. 5 is a graph representing the relationship between the presence of an inverted polarity layer within the GaN substrate of a semiconductor device, and the device's reverse breakdown voltage.

As to the produced semiconductor devices 40, referring to FIG. 5, a study of the relationship between the presence of inverted polarity layers within the GaN substrate 10 and reverse breakdown voltage was made. Herein, "reverse breakdown voltage" means the voltage at which, when a voltage is applied in the reverse direction to a semiconductor device (the voltage thus applied is termed the reverse applied voltage), the semiconductor device is destroyed, and the leakage-current density rapidly increases. In FIG. 5, the horizontal axis represents the reverse applied voltage (V), and the vertical axis represents the leakage current density (A/cm²).

As illustrated in FIG. 5, in the semiconductor devices, in Group A, whose GaN substrates had inversion domains, the reverse breakdown voltage lowered remarkably, compared with that of the semiconductor devices, in Group B, whose GaN substrates did not have inversion domains. From these results it was apparent that the properties of semiconductor devices having within the GaN substrate inversion domains whose surface area along the principal face is 1 to 10,000 μm² were pronouncedly compromised.

Figure 6:
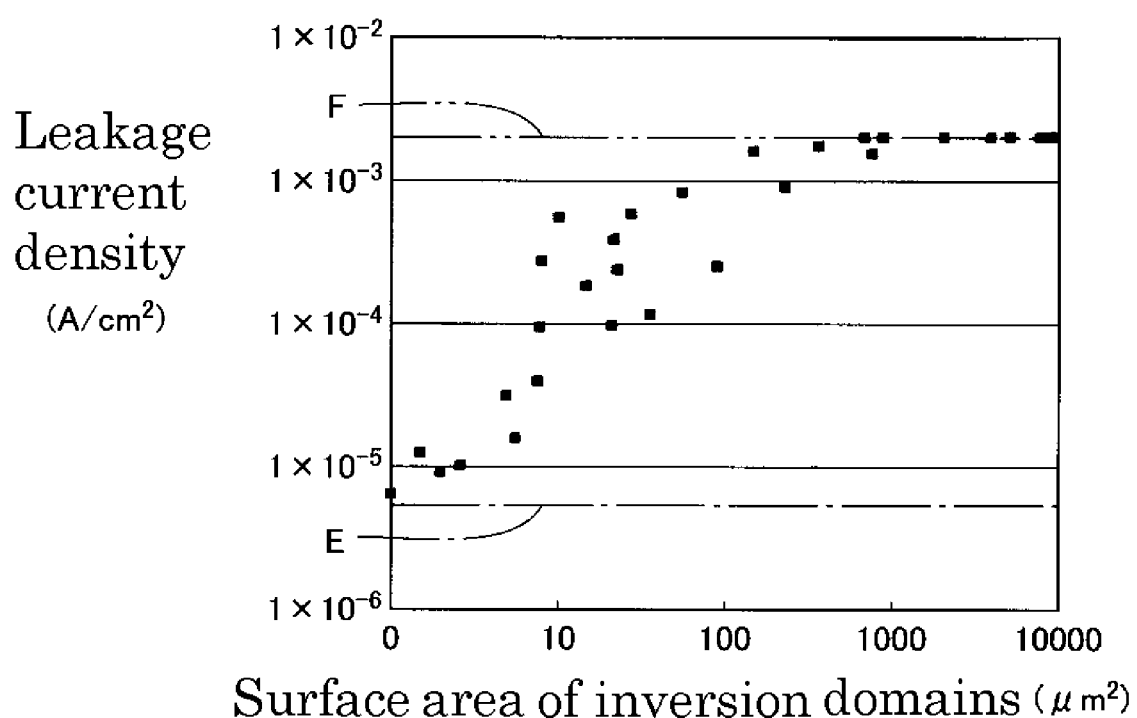
FIG. 6 is a graph representing the relationship between the surface area of inversion domains along the principal face of a semiconductor-device GaN substrate, and the properties of the semiconductor device.

Next, referring to FIG. 6, a study of the relationship between the surface area of inversion domains along the GaN substrate principal face in a semiconductor device, and the semiconductor device properties was made. In FIG. 6, the horizontal axis represents the surface area of the inversion domains along the GaN substrate principal face (units: μm²), the vertical axis represents the leakage-current density (A/cm²), the dot-and-dash line E represents the average leakage-current density in a semiconductor device in which the GaN substrate has no inversion domains, and the double-dot-and-dash line F represents full-scale leakage current density. Herein, the reverse applied voltage was made 100V.

As illustrated in FIG. 6, the leak current density in the semiconductor device gradually rose when the surface area of the inversion domains along the GaN substrate principal face increased to 1 μm² or more, and the leakage-current density rose drastically when the area increased to 5 μm² or more. The possible reason is that in growing epitaxially a semiconductor layer on the GaN substrate principal face with the area of the inversion domains being kept under 5 μm² in the semiconductor layer (not illustrated), low growth rate domains grown on the inversion domains are buried by (not-illustrated) high growth rate domains grown on the principal domain in the semiconductor layer, and thus the inversion domains are not passed to the working portion (for example, the p-n junction) of the semiconductor device.

The results of FIGS. 5 and 6 demonstrated that the presence of the inversion domains where of surface area along the semiconductor principal face of 1 μm² or more adversely affected the semiconductor device properties. Accordingly, with attention being directed to the inversion domains whose surface area along the semiconductor-device principal face is 1 μm² or more, the following study will be carried out.

Referring to FIG. 3, the relationship between the density D (units: cm⁻²) of the inversion domains whose surface area along the principal face 10m of the GaN substrate 10 is 1 μm² or more, and the area Sc (units: cm²) of the principal faces 40m of the semiconductor devices 40 is believed to be as follows. Namely, the likelihood that no inversion domains are present within the principal faces 40m of any semiconductor devices 40 formed on the principal face 10m of the GaN substrate 10 (in other words, the yield with which semiconductor devices (products) of good physical properties are manufactured) is 10% when the product $S_c \times D$ is 2.3, 50% when the product $S_c \times D$ is 0.7, and 90% when the product $S_c \times D$ is 0.1, wherein the probability depends on the product of the area $S_c$ cm² of the principal faces 40m of the semiconductor deices 40 and the density D cm⁻² of the inversion domains 10t along the principal face 10m of the GaN substrate 10. Herein, from the perspective of industrial applicability, the yield rate should exceed 10%. Accordingly, the product $S_c \times D$ is necessarily 2.3, preferably less than 0.7, and more preferably less than 0.1.

What is considered for above conditions on the product $S_c \times D$ is only the density of the inversion domains along the GaN substrate principal face, not their area. More precisely, in the situation in which the surface area of each inversion domain is small, semiconductor device yield can be governed solely by the conditions on the product $S_c \times D$, but in situations in which the surface area of each inversion domain is large, an evaluation of the inversion-domain surface area must be included. Herein, the diversity of surface areas is prohibitive of specifying the surface areas of the inversion domains individually.

Therefore, in calculating the likelihood that no inversion domains are present within the principal faces of any semiconductor devices formed on the GaN substrate principal face (in other words, the yield with which semiconductor devices of good physical properties are manufactured), referring to FIG. 1, the relationship between the total area S (units: cm²) of the GaN substrate principal face and the collective area $S_t$ (units: cm²), along the GaN substrate principal face, of the inversion domains 10t was taken into consideration. That is, the probability that no inversion domains are present varies depending on the ratio $S_t/S$ of the collective area $S_t$ cm² of the inversion domains to the total area S cm² of the GaN substrate principal face—the larger the ratio $S_t/S$, the lower the probability, and the smaller the $S_t/S$, the higher the probability.

In the calculation of the probability that no inversion domains are present, making the probability 10% when the product $S_c \times D$ is 2.3 requires bringing the ratio $S_t/S$ to 0.5 or less, making the probability 50% when the product $S_c \times D$ is 0.7 requires bringing the ratio $S_t/S$ to 0.2 or less, and raising the probability to 90% when the product $S_c \times D$ is 0.1 requires reducing the ratio $S_t/S$ to 0.05 or less. Accordingly, the ratio $S_t/S$ is necessarily made 0.5 or less, preferably 0.2 or less, and more preferably 0.05 or less.

Hereinafter, specifically, the semiconductor device manufacturing method of this embodiment will be described, based on FIG. 1 through FIG. 3. For reference, in FIG. 1 and FIG. 2, the alternate long and two short dashes lines represent chip-dividing lines 41 for dividing in FIG. 3 a semiconductor wafer 30 into chips.

First, referring to FIG. 1, the GaN substrate 10 whose principal face 10m is (0001) Ga face is prepared (a step of preparing a GaN substrate). In the GaN substrate 10, the density of the inversion domains 10t, where the extent of the area, along the principal face 10m of the GaN substrate 10, in which the polarity in the [0001] direction is inverted with respect to the principal domain 10s of the GaN substrate 10 is 1 μm² or more, is D cm⁻². Furthermore, the GaN substrate 10 has a ratio $S_t/S$, of collective area $S_t$ cm² of the collective inversion domains 10t to the total area S cm² of the principal face 10m of the GaN substrate 10, of no more than 0.5. For example, as illustrated in FIG. 1, the inversion domains 10t comprises five inversion domains $10t_1$, $10t_2$, $10t_3$, $10t_4$, and $10t_5$, which have different areas $S_{t1}$, $S_{t2}$, $S_{t3}$, $S_{t4}$, and $S_{t5}$. The collective area $S_t$ of the inversion domains 10t is sum of the areas $S_{t1}$, $S_{t2}$, $S_{t3}$, $S_{t4}$, and $S_{t5}$ of the inversion domains $10_{t1}$, $10t_2$, $10t_3$, $10t_4$, and $10t_5$.

Because in the GaN substrate, the ratio $S_t/S$ of the collective area $S_t$ cm² of the inversion domains 10t to the total area S cm² of the principal face 10m of the GaN substrate 10 is 0.5 or less, the yield of semiconductor devices formed on this substrate can be heightened. Therein, the ratio $S_t/S$ is preferably 0.2 or less, and more preferably 0.1 or less. Furthermore, as described hereinafter, forming semiconductor devices having principal faces whose areas are ideal for density Dc of the inversion domains where the area along the principal face 10m of the GaN substrate 10 is 1 μm² or more heightens the semiconductor device yield.

From the perspective of manufacturing a large number of semiconductor devices efficiently, the area of the principal face 10m on the GaN substrate 10 is preferably 10 cm² or more.

Methods of manufacturing such a GaN substrate are not limited particularly, wherein the examples of the manufacturing methods include HVPE, matalorganic chemical vapor deposition (MOCVD), and molecular beam epitaxy (MBE), and other vapor-phase techniques, and flux-growth and other liquid-phase techniques. There are not any inversion domains discernible on the GaN substrate manufactured by the liquid-phase techniques, but from the perspective of producing large size of crystals at a high growth rate, the vapor-phase techniques are preferable, and in particular HVPE is more preferable. Moreover, because the GaN substrate 10 manufactured by HVPE is often provided with the inversion domains, the present invention is characterized in that controlling the inversion domains leads to high-yield manufacturing of semiconductor devices having superior characteristics.

In manufacturing the GaN substrate by HVPE, possible procedures for reducing the inversion domains that the GaN substrate has are as follows. Among the procedures, there is a procedure in which a GaN crystal is grown by HVPE on a GaN base substrate, produced by liquid-phase techniques, having no inversion domains. In this procedure, however, a large size of GaN base substrate cannot be produced. Furthermore, there is a procedure in which mask layers are formed in the inversion domains on the GaN base substrate, and then the GaN crystal is grown by HVPE to cover the mask layers with the GaN crystal that has been laterally grown. In such a procedure, however, the mask layers are unlikely to form so as to be in correspondence with the inversion domains present randomly on the GaN base substrate.

Therefore, effective is a procedure in which after pits form as a result of etching the inversion domains on the principal face of the GaN substrate, produced by the vapor-phase techniques, having the inversion domains on its principal face, growing the GaN crystal by HVPE prompts burying of the inversion domain having low crystal growth rate in the principal domain having high crystal growth rate. Herein, from the perspective of prompting the burying of the inversion domains, the depth of the pits in the inversion domains of the GaN base substrate is preferably larger than the widths (that are the diameters of approximate circles when the inversion domains can be approximated to the circles, and that are widths of stripes when the domains are shaped into the stripes) of the inversion domains. Herein, in etch, material of etch resistance, such as Pt board, is preferably placed on the back side (the side opposite to the front side, hereinafter) in order to prevent the back side of the GaN base substrate from being etched.

Next, referring to FIG. 2, an at least single-lamina semiconductor layer 20 is grown on the principal face 10m of the GaN substrate 10 (a step of growing a semiconductor layer), and referring to FIG. 3, a semiconductor devices 40 are formed so that the product $S_c \times D$ of the area $S_c$ of the principal faces of the semiconductor devices 40 and the density D of the inversion domains is 2.3 or less (a step of forming a semiconductor device).

With this product $S_c \times D$ being 2.3 or less, preferably 0.7 or less, and more preferably 0.1 or less, semiconductor device yields can be heightened.

Herein, in the semiconductor layer growing step in FIG. 2, a n$^+$-type GaN layer 22, a n-type GaN layer 24 and a p-type GaN layer 26 are successively formed as the at least single-lamina semiconductor layer 20 on the principal face 10m of the GaN substrate 10. As a result, the p-n junction forms between the n-type GaN layer 24 and the p-type GaN layer 26. Next, a Ni/Au laminated electrode (the Ni layer contacts with the GaN layer), serving as a p-side electrode 32, is formed onto the p-type GaN substrate 26, and a Ti/Al laminated electrode (the Ti layer contacts with the n-type GaN substrate), serving as a n-side electrode 34, is formed onto a back side 10n (the side opposite to the principal face 10m) of the n-type GaN substrate (GaN substrate 10), to produce a semiconductor wafer 30.

Furthermore, in the semiconductor device forming step in FIG. 3, the p-side electrode 32, p-type GaN layer 26, and a part of the n-type GaN layer 24 undergo mesa-etching along chip dividing lines 41. Subsequently, the semiconductor wafer 30 is divided along the chip dividing lines 41 into the semiconductor devices 40, in which the areas of their principal faces are $S_c$ cm$^2$. For example, as illustrated in FIG. 3, the one semiconductor wafer 30 is divided into 10 chips C1 to C10 to manufacture 10 semiconductor devices 40.

Herein, the principal faces 40m on the semiconductor devices 40 mean principal faces of the main portion (functional portion) activating the function of the semiconductor devices. In the semiconductor device of this embodiment, the p-n junction corresponds to the principal faces 40m. Although with the principal faces 40m of the manufactured semiconductor devices 40 being small, the inversion domains 10t that the GaN substrate 10 has is not so much disadvantageous, the larger the principal faces 40m of the semiconductor devices 40, the more disadvantageous the inversion domains 10t. Accordingly, the present invention is useful particularly in manufacturing the large size of semiconductor devices 40 in which the areas of their principal faces 40m are 1 mm$^2$ or more.

In this embodiment mode, the recitation has been made on the precondition that the principal face 10m of the GaN substrate 10 in the semiconductor devices 40 is (0001) Ga face, though in practice, the principal face 10m of the GaN substrate 10 may have a slightly misoriented angle with respect to the (0001) Ga face.

Embodiment Mode 2

Another embodiment mode of the semiconductor device involving the present invention is a semiconductor device manufactured by the manufacturing method in Embodiment Mode 1. In the semiconductor device of Embodiment Mode 2, referring to FIG. 4, the n$^+$-type GaN layer 22, n-type GaN layer 24 and p-type GaN layer 26 are formed as the at least single-laminar semiconductor layer 20 on the GaN substrate 10. Furthermore, the Ni/Au laminated electrode, serving as the p-side electrode 32, is formed onto the p-type GaN substrate 26, and the Ti/Al laminated electrode, serving as the n-side electrode 34, is formed onto the back side 10n of the n-type GaN substrate.

With reference to FIG. 1 through FIG. 4, semiconductor devices of this embodiment are the semiconductor devices 40, in which the areas of their principal faces 40m are $S_c$ cm$^{-2}$, formed employing the GaN substrate 10 in which the density of the inversion domains 10t, where the area along the principal face 10m is 1/m$^2$ or more, is D cm$^{-2}$, the total area of the principal face 10m is S cm$^2$, and the collective area of the inversion domains 10t is $S_t$ cm$^{-2}$. Because the ratio $S_t/S$ is 0.5 or less, and the product $S_c \times D$ is less than 2.3, the properties of semiconductor devices can be enhanced. Therein, preferably, the ratio $S_t/S$ is 0.2 or less, and the product $S_c \times D$ is less than 0.7, and more preferably, the ratio $S_t/S$ is 0.05 or less, and the product $S_c \times D$ is less than 0.1.

Embodiments

Embodiment 1

1. Preparation of GaN Substrate

As a base substrate, the GaN substrate in which (0001) Ga face, whose diameter was 2 inches (50.8 mm), and whose depth was 400 μm, was the principal face was employed. As a result of etching for 30 minutes the principal face of the base substrate with a mixture of KOH and NaOH (mass ratio: 1:1) at 300° C., 352 pits in hexagonal cylinder shape formed in the inversion domains on the principal face. During etch, keeping a Pt board in close contact with the back side (the side opposite to the front side) of the base substrate prevented etching solution from running into the back side of the base substrate. The hexagonal-cylinder-shaped pits caused by the etching were 20 μm to 100 μm in width (diameter of the approximate circles), and 20 μm to 250 μm in depth.

A GaN crystal layer 10 mm in thickness was grown by HVPE on the base substrate principal face in which the hexagonal-cylinder-shaped pits had formed. Herein, the temperature at which Ga source gas was generated was made 850° C., and the temperature at which a GaN crystal was grown was 1200° C. An added feature of the experimental design was to make the GaN substrate growing temperature 1000° C. or more, which reduced the inversion domains as the GaN crystal grew.

The grown GaN crystal layer was sliced paralleling the base substrate principal face to a thickness of 500 μm to produce 10 GaN substrates whose principal faces are (0001) Ga faces. These substrates were defined as S1, S2, S3, S4, S5, S6, S7, S8, S9, and S10 from the substrate side. In all the GaN substrates, the diameter of their principal faces was 2 inches (5.08 cm), and the area S of their principal faces was 20 cm$^2$.

The produced GaN substrates were etched for 30 minutes with a 2-normality KOH solution at 50° C., and the number of the pits (corresponding to the inversion domains) formed on the principal faces was counted, to calculate the density D cm$^{-2}$ of the inversion domains on the principal faces. The density D cm$^{-2}$ of the inversion domain on the principal faces of the more distant GaN substrates (the substrates produced from a further grown part of the crystal) from the base substrate side further lowered. Herein, as to each of the GaN substrates, the precise collective area of the inversion domains was not measured. The collective area $S_t$ cm$^2$ of the inversion domains was calculated, letting the area of each of the inversion domains was 0.196 cm$^2$ of less, because the width of each of the inversion domains (the diameter of the approximate circle) was 500 μm or less (the area was 0.196 cm$^2$ of less). The results are set forth in the table.

2. Semiconductor Layer Growth

Referring to FIG. 2, the principal faces 10m of the GaN substrates 10 were polished again, and then the 0.6-μm thick n$^+$-type GaN layer 22, 7-μm thick n-type GaN layer 24 (electron concentration was $3 \times 10^{16}$ cm$^{-3}$), and 0.5-μm thick p-type GaN layer 26 (Mg atomic concentration was $7 \times 10^{17}$ cm$^{-3}$) were formed by MOCVD as the semiconductor layer 20 on the principal faces 10 that had been polished again. As a result, the p-n junction formed between the n-type GaN layer 24 and the p-type GaN layer 26. Subsequently, a Ni layer and an Au layer were formed successively by vapor-deposition techniques to form a Ni/Au laminated electrode, serving as the p-side electrode 32, on the p-type GaN layer 26. As a result, a semiconductor wafer 30 was produced for each of the GaN substrates 10.

3. Semiconductor Device Formation

Referring to FIG. 3, in the semiconductor wafer 30, the p-side electrode 32, p-type GaN layer 26, and a part of the n-type GaN layer 24 undergone mesa-etching along the chip dividing lines 41. Subsequently, the semiconductor wafer was divided along the chip dividing lines 41 into 10 chips C1 to C10 to produce from the wafer 30 10 semiconductor devices 40, in which the area of the principal faces 40m (the p-n junction in this embodiment) was 1 cm$^2$. The produced 10 semiconductor devices undergone reverse breakdown voltage test, and the semiconductor device yield (units: %) was evaluated on the preconditions that semiconductor devices with reverse breakdown voltage of 500 V or more were products. The results are set forth in the table.

$S_c \times D$ less than 0.7 could bring the semiconductor device yield to 50% or more. Moreover, lowering the ratio $S_t/S$ to 0.05 or less and the product $S_c \times D$ to less than 0.1 could raise the semiconductor device yield to 90% or more.

The presently disclosed embodiments and implementation examples should in all respects be considered to be illustrative and not limiting. The scope of the present invention is set forth not by the foregoing description but by the scope of the scope of the patent claims, and is intended to include meanings equivalent to the scope of the patent claims and all modifications within the scope.

What is claimed is:

1. A method of manufacturing a plurality of semiconductor devices, each of device principal-face surface area $S_c$ predetermined by an at least 1 mm$^2$ minimum size allowing the device to be functional, on a GaN device wafer screened from a plurality of vapor-phase grown GaN substrates to ensure a minimum 10% yield from the plurality of semiconductor devices, as defined by a minimum reverse breakdown voltage acceptable for the devices to be products, the method comprising:

a step of producing a plurality of GaN substrates by an inversion-domain reducing vapor-phase growth process, the substrates each defining a principal face that is either the (0001) Ga face or a surface vicinally misoriented with respect to the (0001) Ga face;

a step of testing the plurality of GaN substrates to screen for a minimum 10% device yield, said testing and screening step including a substep of characterizing inversion domains in the principal face of each of the plurality of GaN substrates by one technique selected from i) etching the substrates with a predetermined alkali solution for a predetermined time at a predetermined temperature, ii) cathodoluminescence, or iii) observation under a fluorescence microscope, and based on the inversion-domain characterization, determining, for each of the plurality of GaN substrates, the principal-face area $S_t$ cm$^2$ of the inversion domains collectively, finding the ratio $S_t/S$, of $S_t$ to the total area S cm$^2$ of the substrate principal face, and selecting, as prepared GaN substrates from the plurality of GaN substrates, GaN substrates whose $S_t/S$ is not greater than 0.5;

TABLE

| GaN substrate | GaN substrate principal face surface area S (cm$^2$) | Number of inversion domains | Density of inversion domains D (cm$^{-2}$) | Collective area of inversion domains St (cm$^2$) | Ratio $S_t/S$ | Semiconductor device principal face surface area Sc (cm$^2$) | Product $S_c \times D$ | Semiconductor device yield (%) |
|---|---|---|---|---|---|---|---|---|
| S1 | 20 | 51 | 2.55 | ≦10.0 | ≦0.50 | 1 | 2.55 | 0 |
| S2 | 20 | 45 | 2.25 | ≦8.8 | ≦0.44 | 1 | 2.25 | 10 |
| S3 | 20 | 35 | 1.75 | ≦6.9 | ≦0.35 | 1 | 1.75 | 20 |
| S4 | 20 | 16 | 0.80 | ≦3.1 | ≦0.16 | 1 | 0.80 | 40 |
| S5 | 20 | 12 | 0.60 | ≦2.4 | ≦0.12 | 1 | 0.60 | 60 |
| S6 | 20 | 5 | 025 | ≦0.98 | ≦0.05 | 1 | 0.25 | 80 |
| S7 | 20 | 4 | 0.20 | ≦0.78 | ≦0.04 | 1 | 0.20 | 80 |
| S8 | 20 | 3 | 0.15 | ≦0.59 | ≦0.03 | 1 | 0.15 | 90 |
| S9 | 20 | 1 | 0.05 | ≦0.20 | ≦0.01 | 1 | 0.05 | 100 |
| S10 | 20 | 0 | 0 | 0 | 0 | 1 | 0 | 100 |

As is clear from the table, in the semiconductor device manufacturing method involving the present invention, making the ratio $S_t/S$ 0.5 or less and the product $S_c \times D$ less than 2.3 could bring the semiconductor device yield to 10% or more. Furthermore, making the ratio $S_t/S$ 0.2 or less and the product a substep of determining the number of inversion domains of 1 μm$^2$ or greater surface area in the principal face of the prepared GaN substrates, as D cm$^{-2}$; and a substep of selecting those prepared GaN substrates whose product $S_c \times D$ is less than 2.3, as correlating to a device yield of at least 10% from semiconductor devices, each of said principal-face functional surface area $S_c$ when grown on the substrates;

a step of growing an at least single-lamina, device-forming semiconductor layer onto the principal face of the selected prepared GaN substrates;

a step of dividing each of the selected prepared GaN substrates, on which the device-forming semiconductor layer has been grown into chips each of area $S_c$;

a step of reverse-breakdown-voltage testing the device chips for the at least 10% whose reverse breakdown voltage is at or above the acceptable minimum.

2. A method as set forth in claim 1, wherein in said testing and screening step, GaN substrates whose ratio $S_t / S$ is 0.2 or less are selected as prepared GaN substrates, and the selected prepared GaN substrates are those whose product $S_c \times D$ is less than 0.7.

3. A method as set forth in claim 1, wherein in said testing and screening step, GaN substrates whose ratio $S_t / S$ is 0.05 or less are selected as prepared GaN substrates, and the selected prepared GaN substrates are those whose product $S_c \times D$ is less than 0.1.

4. A method as set forth in claim 1, wherein the area of the principal face of each of the plurality of GaN substrates is 10 cm$^2$ or more.

5. A method as set forth in claim 1, wherein the vapor-phase growth process in said step of producing a plurality of GaN substrates is HVPE.

6. A method as set forth in claim 1, wherein the functional surface area $S_c$ is at least 1 cm$^2$.

7. A method as set forth in claim 1, wherein said step of producing a plurality of vapor-phase grown GaN substrates is carried out by:

obtaining a GaN base substrate having a (0001) Ga principal face;

etching the (0001) Ga principal face of the GaN base substrate with a predetermined alkali solution, and for a predetermined time at a predetermined temperature, so that thereby pits forming in inversion domains on the (0001) Ga principal face are of greater depth than width;

growing, by HVPE at a temperature of not less than 1000° C., a GaN crystal layer to a thickness enabling the layer to be sliced into plural substrates; and slicing the grown GaN crystal layer paralleling the (0001) Ga principal face of the base substrate to produce a plurality of GaN substrates whose principal faces are (0001) Ga faces.

8. A method as set forth in claim 1, wherein the total area S cm$^2$ of the principal face of each of the plurality of GaN substrates is about 20 cm$^2$.

9. A method as set forth in claim 1, wherein the acceptable minimum reverse breakdown voltage is 500 V.

* * * * *